(12) United States Patent
Foust et al.

(10) Patent No.: US 7,011,983 B2
(45) Date of Patent: Mar. 14, 2006

(54) LARGE ORGANIC DEVICES AND METHODS OF FABRICATING LARGE ORGANIC DEVICES

(75) Inventors: Donald F. Foust, Glenville, NY (US);
Anil R. Duggal, Niskayuna, NY (US);
Richard J. Saia, Niskayuna, NY (US);
Herbert S. Cole, Burnt Hills, NY (US)

(73) Assignee: General Electric Company, Niskayuna, NY (US)

( * ) Notice: Subject to any disclaimer, the term of this patent is extended or adjusted under 35 U.S.C. 154(b) by 271 days.

(21) Appl. No.: 10/324,417

(22) Filed: Dec. 20, 2002

(65) Prior Publication Data
US 2004/0121508 A1   Jun. 24, 2004

(51) Int. Cl.
*H01L 51/40* (2006.01)
(52) U.S. Cl. .......... 438/99; 438/118; 438/608; 438/609
(58) Field of Classification Search .......... 438/99, 438/118, 119, 608, 609
See application file for complete search history.

(56) References Cited

U.S. PATENT DOCUMENTS 6,472,804 B1 * 10/2002 Mueller et al. ............. 313/326
2001/0033135 A1 * 10/2001 Duggal et al. ............. 313/506

* cited by examiner

*Primary Examiner*—Amir Zarabian
*Assistant Examiner*—Christy Novacek
(74) *Attorney, Agent, or Firm*—Fletcher Yoder

(57) ABSTRACT

Large, light-weight organic devices and methods of preparing large, light-weight organic devices. Specifically, flexible and rigid light-weight plastics are implemented. The flexible plastic may be disposed from a reel. A metal grid is fabricated on the flexible plastic to provide current conduction over the large area. A transparent oxide layer is provided over the metal grid to form the bottom electrode of the organic device. A light emitting or light gathering organic layer is disposed on the transparent oxide layer. A second electrode is disposed over the organic layer. Electrodes are coupled to the metal grid and the second electrode to provide electrical current to or from the organic layer. Depending on the type of materials used for the organic layer, the organic device may comprise an area light device or a photovoltaic device.

26 Claims, 3 Drawing Sheets

US 7,011,983 B2

LARGE ORGANIC DEVICES AND METHODS OF FABRICATING LARGE ORGANIC DEVICES

BACKGROUND OF THE INVENTION

Large area semiconductive organic-based devices for producing light from electrical energy (lighting sources) and devices for producing electrical energy from light (photovoltaic sources) may be used in a wide variety of applications. For instance, high efficiency lighting sources are continually being developed to compete with traditional area lighting sources, such as fluorescent lighting. While light emitting diodes have traditionally been implemented for indicator lighting and numerical displays, advances in light emitting diode technology have fueled interest in using such technology for area lighting. Light Emitting Diodes (LEDs) and Organic Light Emitting Diodes (OLEDs) are solid-state semiconductor devices that convert electrical energy into light. While LEDs implement inorganic semiconductor layers to convert electrical energy into light, OLEDs implement organic semiconductor layers to convert electrical energy into light. Generally, OLEDs are fabricated by disposing multiple layers of organic thin films between two conductors or electrodes. The electrode layers and the organic layers are generally disposed between two substrates, such as glass substrates. When electrical current is applied to the electrodes, light is produced. Unlike traditional LEDs, OLEDs can be processed using low cost, large area thin film deposition processes. OLED technology lends itself to the creation of ultra-thin lighting displays. Significant developments have been made in providing general area lighting implementing OLEDs.

However, while traditional OLEDs having a relatively low efficacy (e.g. 3–4 lumens per watt) may be able to achieve sufficient brightness for area lighting at low voltages, the operating life of the OLED may be limited due to the heat generated by the high power level and relatively low efficiency of the device. To provide commercially viable light sources implementing OLEDs, the efficacy of the devices should be improved to reduce the heat generation when operating at a brightness sufficient to provide general illumination.

To emit light having a lumen output that is comparable to the light produced by conventional lighting sources such as fluorescent lighting sources, the OLED may be large, approximately one square meter, for example. A number of issues may arise when contemplating fabrication of a large OLED having a front surface area of one square meter, for instance. When fabricating OLED devices, conventional OLED devices implement top and bottom glass plates. Advantageously, glass substrates provide adequate hermeticity to seal the device from exposure to water and oxygen. Further, glass substrates allow for high temperature processing of the OLED devices. However, glass substrates may be impractical and less desirable when contemplating the fabrication of large area OLED devices for area lighting when compared to conventional area lighting sources, such as fluorescent lighting sources. Generally speaking, glass may be impractically heavy for area-lighting applications. For instance, to produce the light equivalent to a four foot T12 fluorescent lamp, for example, an OLED device implementing glass substrates having a thickness of ⅛ of an inch and a front surface area of one square meter may weigh approximately 31 pounds. The T12 fluorescent lamp weighs less than one-half a pound. One method of reducing the weight of the OLED device is to implement plastic substrates. However, while plastic substrates advantageously reduce the weight of the device, the hermeticity of the device may be compromised.

Further, as can be appreciated, general area lighting is widely used and the demands for such lighting are understandably high. Accordingly, to provide a viable alternative source for area lighting to that of fluorescent lighting, for example, the alternative source should be fairly robust and easy to manufacture. OLED devices implementing large glass substrates may be difficult to mass-produce in a highly automated process. The weight of glass and fragility of glass substrates may disadvantageously burden the manufacturing process.

Still further, as can be appreciated, the active layers of organic polymers or small-molecules implemented in OLED devices are disposed between conducting electrodes. The top electrode generally comprises a reflective metal such as aluminum, for example. The bottom electrode generally comprises a transparent conductive oxide (TCO) material, such as Indium-Tin-Oxide (ITO), that allows light produced by the active layers to be emitted through the bottom electrode. To maximize the amount of light that is emitted from the OLED device, the thickness of the ITO layer may be minimized. In typical OLED devices, the ITO layer has a thickness of approximately 1000 angstroms. However, the conductivity of 1000 angstroms of ITO may not be adequate to supply sufficient electrical current across the entire surface area of the large OLED. Accordingly, the electrical current may be insufficient to generate enough light across the large OLED for use in area lighting applications.

As can be appreciated, photovoltaic (PV) devices may be fabricated using similar materials and concepts as the OLED devices. Semiconductive PV devices are generally based on the separation of electron-hole pairs formed following the absorption of a photon from a light source, such as sunlight. An electric field is generally provided to facilitate the separation of the electrical charges. The electric field may arise from a Schottky contact where a built-in potential exists at a metal-semiconductor interface or from a p-n junction between p-type and n-type semiconducting materials. Such devices are commonly made from inorganic semiconductors, especially silicon, which can have monocrystalline, polycrystalline, or amorphous structure. Silicon is normally chosen because of its relatively high photon conversion efficiency. However, silicon technology has associated high costs and complex manufacturing processes, resulting in devices that are expensive in relation to the power they produce.

Like OLEDs, organic PV devices, which are based on active semiconducting organic materials, have recently attracted more interest as a result of advances made in organic semiconducting materials. These materials offer a promise of better efficiency that had not been achieved with earlier organic PV devices. Typically, the active component of an organic PV device comprises at least two layers of organic semiconducting materials disposed between two conductors or electrodes. At least one layer of organic semiconducting material is an electron acceptor, and at least one layer of organic material is an electron donor. An electron acceptor is a material that is capable of accepting electrons from another adjacent material due to a higher electron affinity of the electron acceptor. An electron donor is a material that is capable of accepting holes from an adjacent material due to a lower ionization potential of the electron donor. The absorption of photons in an organic photoconductive material results in the creation of bound electron-hole pairs, which must be dissociated before charge collection can take place. The separated electrons and holes travel through their respective acceptor (semiconducting material) to be collected at opposite electrodes.

While the particular layers of organic semiconducting materials that are implemented in PV devices, may differ from the particular layers of organic materials implemented in OLED devices, the similarity in structure between the PV devices and the OLED devices provides similar design and fabrication challenges. In some instances, techniques implemented in fabricating OLED devices may also be implemented in fabricating PV devices and visa versa. Accordingly, similar issues and challenges may arise in contemplating the fabrication of large area OLED devices and large area PV devices.

BRIEF DESCRIPTION OF THE INVENTION

In accordance with one aspect of the present techniques, there is provided a method of fabricating an organic device comprising the acts of: fabricating a transparent backer portion; fabricating an active portion, wherein the active portion comprises an organic layer disposed between a first electrode and a second electrode; coupling the transparent backer portion to the active portion; and coupling electrical leads to each of the first electrode and the second electrode.

In accordance with another aspect of the present techniques, there is provided a method of fabricating an organic device comprising the acts of: providing a flexible transparent film; forming a metal grid pattern on the flexible transparent film; disposing a transparent conductive oxide (TCO) layer over the metal grid pattern and the transparent film; disposing the organic layer over the transparent conductive oxide layer; and disposing a metal layer over the organic layer.

In accordance with yet another aspect of the present techniques, there is provided a system comprising: a rigid plastic layer; a hermetic coating layer disposed on the rigid plastic layer; a flexible transparent film coupled to the hermetic coating layer; a metal grid pattern formed on the flexible transparent film; a transparent conductive oxide (TCO) layer disposed over the metal grid pattern and the transparent film; an organic layer disposed over the transparent conductive oxide layer; and a metal layer disposed over the organic layer.

BRIEF DESCRIPTION OF THE DRAWINGS

Advantages and features of the invention may become apparent upon reading the following detailed description and upon reference to the drawings in which.

DETAILED DESCRIPTION OF SPECIFIC EMBODIMENTS

Figure 1:
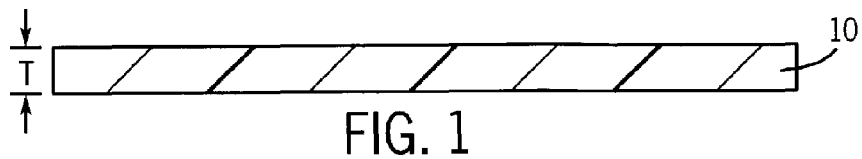
FIGS. 1–4 illustrate cross-sectional views of an exemplary fabrication process for a transparent backer implemented in a large-area organic device fabricated in accordance with the present techniques.

FIGS. 1–4 illustrate cross-sectional views of an exemplary process for fabricating a transparent backer implemented in a large-area organic device in accordance with the present techniques. As can be appreciated, the exemplary fabrication techniques may be implemented to fabricate large area OLED devices, or large area PV devices, for example. Referring initially to FIG. 1, a film or sheet of transparent plastic 10 which may comprise any suitable polycarbonate, such as a sheet of LEXAN polycarbonate, for example, is provided. Preferably, the plastic 10 comprises any material having a high melting point, thereby allowing for high processing temperatures (e.g., >200° C.). Further, the plastic 10 is advantageously transparent and has a high rate of transmission of visible light (e.g., >85% transmission). Further, the plastic 10 may advantageously comprise a material having a high impact strength, flame retardancy and thermoformability, for example. Because the plastic 10 may be rigid, the plastic 10 may also provide structural support for the large area organic device, as described further below.

The plastic 10 should be large enough to provide sufficient light for use in area-lighting or large enough to provide sufficient surface area for efficient light absorption in a photovoltaic device. In the present exemplary embodiment, the plastic 10 may have a length of approximately 4 feet and a width of approximately 1 foot, for example. As can be appreciated, other desirable dimensions of the plastic 10 may be implemented. The plastic 10 may have a thickness T in the range of approximately 1–125 mils. As can be appreciated, a material having a thickness of less than 10 mils may generally be referred to as a "film" while a material having a thickness of greater than 10 mils may generally be referred to as a "sheet." It should be understood that the plastic 10 may comprise a plastic film or a plastic sheet. Further, while the terms may connote particular thicknesses, the terms may be used interchangeably, herein. Accordingly, the use of either term herein is not meant to limit the thickness of the respective material, but rather, is provided for simplicity. Generally speaking, a thinner plastic 10 may provide a lighter and less expensive material. However, a thicker plastic 10 may provide more rigidity and thus structural support for the large area organic device. The thickness of the plastic 10 may depend on the particular application.

Figure 2:
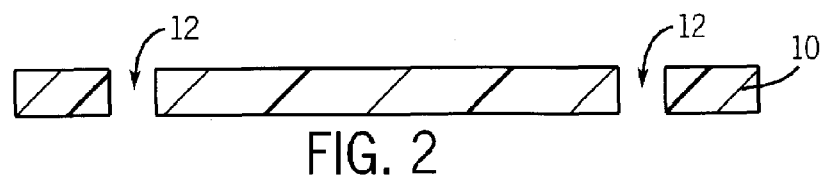

In fabricating the transparent backer, apertures 12 are provided to facilitate the electrical connection of the large area organic device, as illustrated in FIG. 2. The apertures 12 may be any suitable size and shape to facilitate the electrical connection of the leads to the bottom electrode, as will be illustrated and further described with respect to FIGS. 12 and 13. As can be appreciated, the apertures 12 may be formed through laser ablation, for example. Alternatively, the apertures 12 may be formed through a drilling process, a stamping process or a molding process wherein the plastic 10 is heated and dispensed into a mold having structures configured to form the apertures 12. As used herein, "adapted to," "configured to," and the like refer to elements that are sized, arranged or manufactured to form a specified structure or to achieve a specified result.

Figure 3:
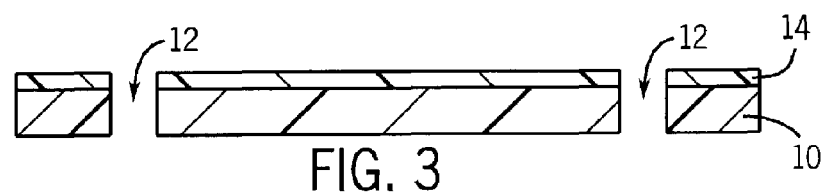

In the present embodiment of the transparent backer, a hermetic coating 14 is applied over the plastic 10, as illustrated in FIG. 3. As can be appreciated, one of the degradation mechanisms that may reduce the mean-time-to-failure of an unencapsulated organic device is exposure of the organic cathode interface (described further below) to atmospheric oxygen and water. Disadvantageously, exposure to oxygen or water may lead to oxidation and/or delamination of the metal cathode as well as to chemical reactions within the organic layers. Accordingly, the hermetic coating 14 is implemented to impart water and oxidation resistance on the light-emitting side of the device, as better illustrated and described with reference to FIGS. 10–13. The hermetic coating 14 may comprise two or more polymer-based materials, such as LEXAN polycarbonate, separated by layers of transparent inorganic materials. The layers of inorganic materials may comprise diamond-like-carbon (DLC), silicon dioxide, silicon nitride or silicon oxy nitride, for example.

In one specific exemplary embodiment, the hermetic coating 14 comprises a hybrid organic-inorganic multi-layer barrier coating formed on a heat stabilized polyethylene terephthalate (PET) material having a thickness of approximately 175 microns. The composite barrier may comprise alternating layers of polyacrylate films and an inorganic oxide, for example. An acrylic monomer layer may be deposited onto the surface of the PET material by flash evaporation in a vacuum, for example. After deposition, the condensed acrylic monomer maybe cured using ultraviolet light to form a non-conformal highly cross-linked polyacrylate film that planarizes the surface of the PET layer. Next a layer of aluminum oxide ($Al_2O_3$) may be deposited onto the polyacrylate film layer at a thickness in the range of approximately 100–300 angstoms, for example, to provide a barrier to the diffusion of water and oxygen. Advantageously, by alternately repeating the processes to deposit multiple layers, the polymer layers (e.g., polyacrylate film) decouple any defects in the oxide layers (e.g., aluminum oxide layer) thereby preventing propagation of defects through the multi layer hermetic coating 14. In one embodiment, the processes are repeated 4–5 times, for example.

Figure 4:
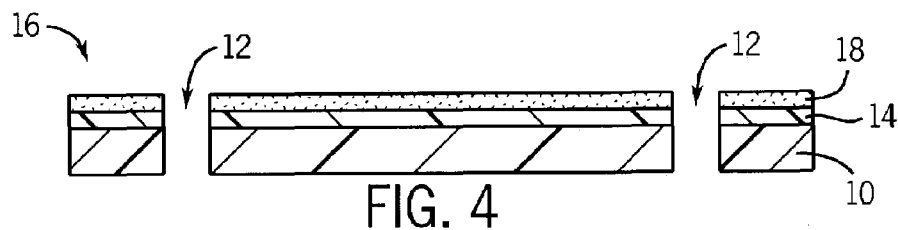

FIG. 4 illustrates one embodiment of the exemplary transparent backer 16. For large area OLED devices, the light produced by the organic layers (described with reference to FIG. 8) will be emitted through the transparent backer 16. To facilitate the coupling of the transparent backer 16 to the active portion of the large area OLED device (described with reference to FIGS. 5–9), an adhesive layer 18 may be applied to the surface of the hermetic coating 14. The adhesive layer 18 comprises a highly transmissive material so as to allow the light produced by the organic layers to be emitted to the ambient environment. As can be appreciated, it may also be desirable to change the color of the light produced by the organic layer of the OLED. Accordingly, to change the color of the light emitted by the organic layer of the OLED, the adhesive layer 18 may include phosphor or scattering particles, as can be appreciated by those skilled in the art. For instance, short wavelength blue light produced by certain organic materials may activate phosphor particles in the adhesive layer 18 to emit a longer wavelength broadband spectrum that is perceived as white light, which may be preferable for area lighting. Alternatively, a color changing layer comprising phosphor particles, for example, may be disposed separately, below the adhesive layer 18.

For PV devices, an incident light source, such as sunlight is generally directed through the transparent backer 16 such that it may be absorbed by the active portion of the PV device (described with reference to FIGS. 5–9). As with OLED devices, for PV devices, phosphor particles may be implemented in the adhesive layer 18 to convert sunlight to wavelengths that are more readily absorbed by the organic layers. Further, the adhesive layer 18 may include scattering particles to enhance light trapping, as can be appreciated by those skilled in the art.

Figure 5:
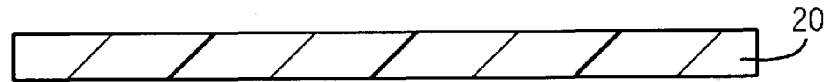
FIGS. 5–9 illustrate cross-sectional views of an exemplary fabrication process of an active portion of a large-area organic device fabricated in accordance with the present techniques.

FIGS. 5–9 illustrate cross-sectional views of an exemplary fabrication process of an active portion of a large-area organic device, such as an OLED device or a PV device, fabricated in accordance with the present techniques. Referring initially to FIG. 5, a layer of transparent film 20 is illustrated. The transparent film 20 is transparent to visible light and may comprise a polymer material, such as MYLAR, for example. The transparent film 20 is generally thin (2–50 mils) and flexible. The transparent film 20 may be dispensed from a roll, for example. Advantageously, implementing a roll of transparent film 20 enables the use of high-volume, low cost, reel-to-reel processing and fabrication of the active portion. The roll of transparent film 20 may have a width of 1 foot, for example, to match the width of the plastic 10 of the transparent backer 16. The transparent film 20 may also be cut to a length to match the length of the plastic 10, such as a length of four (4) feet, for example. As can be appreciated, the transparent film may be cut before or after the fabrication steps described with reference to FIGS. 5–9. Alternatively, the transparent film 20 may comprise a less flexible transparent material, such as MYLAR.

As previously described, typical OLEDs which are implemented for indicator lighting, for example, and generally comprise a number of organic layers disposed between two electrodes. One of the electrodes generally comprises a transparent conductive oxide (TCO), such as indium-tin-oxide (ITO), for example. ITO is a conductive ceramic having a resistivity of approximately 10 ohms/square. This amount of electrical conductivity is generally adequate to produce the necessary light emissions to illuminate the small OLEDs used for indicator lighting. However, as can be appreciated, the power output of a conventional ITO layer may be insufficient to produce the necessary current to illuminate a large area OLED, such as the present device, since the resistance losses across the large surface area may be large. Because the electrode comprises a transparent material to allow light emissions to pass from the underlying organic layers to the ambient environment, a metal layer having a higher conductivity may not be used. Further, while increasing the thickness of the ITO layer may increase the conductivity, the increased thickness may disadvantageously reduce the transparency of the layer. Similarly, limited conductivity may also reduce the efficiency of PV devices, as can be appreciated by those skilled in the art.

Figure 6:
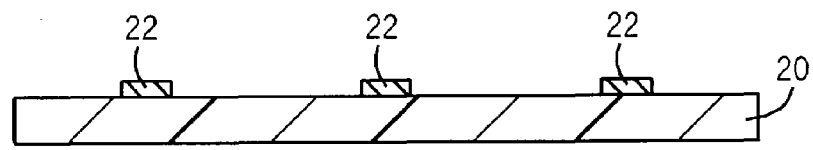

One solution to the limited conductivity of the ITO is to implement a metal grid 22, as indicated in FIG. 6. The metal grid 22 is electrically coupled to the ITO layer 24 (illustrated in FIG. 7) to provide increased conductivity across the bottom electrode (i.e., the ITO layer 24). The metal grid 22 may comprise aluminum, for example. Alternatively, the metal grid 22 may comprise another conductive metal such as silver or copper, for example. To form the metal grid 22, a metal layer may be disposed over the transparent film 20 at a thickness in the range of 0.5–2.0 microns, by a sputtering technique, for example. The metal layer may be patterned and etched to provide a metal grid 22 having a plurality of metal square disposed thereon. The metal squares may comprise ½"×½" squares or 1"×1" squares, for example. The squares may be located every 2–4 inches, for example. Alternatively, the metal layer may be patterned to provide any other desirable pattern having interdispersed metal areas for increased conductivity. For instance, circles, rectangles or linear strips may be patterned to provide the metal grid 22. The metal grid 22 will be electrically coupled to conductive leads, as will be illustrated and described further with reference to FIGS. 12 and 13. As can be appreciated, the metal grid 22 provides increased conductivity through the ITO layer 24, illustrated with reference to FIG. 7.

Figure 7:
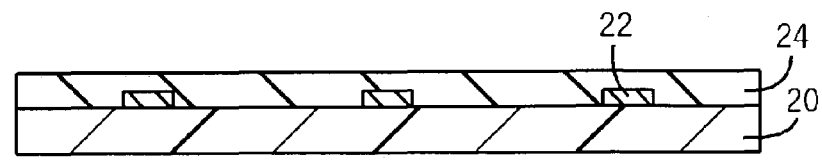

FIG. 7 illustrates a transparent conductive layer, such as an ITO layer 24 disposed over the transparent film 20 and the metal grid 22. The ITO layer 24 may be disposed at a thickness in the range of approximately 500–2500 angstroms, for example, and may be disposed by a sputtering technique, for example. Preferably, the ITO layer 24 has a transmission ratio of at least 0.8. The transparent conductive layer may comprise other suitable conductive materials that may be disposed at other suitable thicknesses and having a transmission ratio of at least 0.8, as can be appreciated by those skilled in the art. The ITO layer 24 may be referred to herein as the "bottom electrode." In the present exemplary embodiment, the ITO layer 24 may comprise the anode of the organic device. Alternatively, the ITO layer 24 may comprise the cathode, as can be appreciated by those skilled in the art. Further, the ITO layer 24 may not comprise a continuous layer. As can be appreciated by those skilled in the art, the electrodes (and possibly the organic layer disposed therebetween) of an OLED device may be patterned or "pixelated" to provide a dense layer of discrete, electrically isolated patches or "pixels." By pixelating the electrodes of the OLED device (including the ITO layer 24) such that the patterns align, shorting between the top and bottom electrodes will only effect the pixels that are shorted, rather than shorting the entire electrode. These techniques are well known to mitigate complete failure of the OLED devices. As can be appreciated, such techniques may also be implemented for PV devices.

Figure 8:
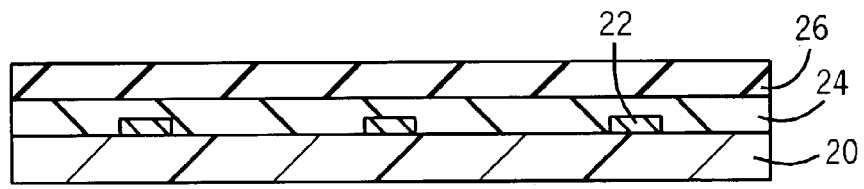

After formation of the bottom electrode (here, ITO layer 24), an organic layer 26 may be disposed on the surface of the ITO layer 24, as illustrated in FIG. 8. As can be appreciated, for an OLED device, the organic layer 26 may comprise several layers of organic light-emitting polymers, such as a polyphenylene vinylene or a polyfluorene, typically from a xylene solution. The number of layers and the type of organic polymers disposed will vary depending on the application, as can be appreciated by those skilled in the art. The organic layer 26 may be disposed at a thickness in the range of approximately 500–2500 angstroms, for example. However, as can be appreciated, the thickness of the organic layer 26 may vary, depending on the application. In one exemplary embodiment of an OLED device, the organic layer 26 may comprise a conducting polymer such as poly(3,4)-ethylendioxythiophene/polystrene sulfonate (PEDOT/PSS) and a blue-light emitting polymer such as polyfluorene. As previously described, to convert the blue-light to white light for use in area lighting, one or more conversion layers comprising organic molecules, such as perylene orange and perylene red, and inorganic phosphor particles, such as [Y(Gd)AG:Ce)], may be included in the adhesive layer 18 (FIG. 4) or disposed below the adhesive layer 18. Various layers may be implemented in the organic layer 26 to provide light in a desired color. Certain colors may be easier and/or cheaper to produce in the organic layer 26 based on the available materials and the processes for disposing the materials, as can be appreciated by those skilled in the art.

As previously described, if the large area device is a PV device, the types of organic materials used for the organic layer 26 may be different from those described above with reference to the large area OLED devices. An organic PV device comprises one or more layers that enhance the transport of charges to the electrodes, as described above. For example, in a PV device, the organic layer 26 may include an electron donor material and an electron acceptor material. The electron donor layer may comprise metal-free phthalocyanine; phthalocyanine pigments containing copper, zinc, nickel, platinum, magnesium, lead, iron, aluminum, indium, titanium, scandium, yttrium, cerium, praseodymium, lanthanum, neodymium, samarium, europium, gadolinium, terbium,dysprosium, holmium, erbium, thulium, ytterbium, and lutetium; quinacridone pigment; indigo and thioindigo pigments; merocyanine compounds; cyanine compounds; squarylium compounds; hydrazone; pyrazoline; triphenylmethane; triphenylamine; conjugated electroconductive polymers, such as polypyrrole, polyaniline, polythiophene, polyphenylene, poly(phenylene vinylene), poly(thienylene vinylene), poly(isothianaphthalene); and poly(silane), for instance. Further, the electron donor material may also include a hole transport material, such as triaryldiamine, tetraphenyldiamine, aromatic tertiary amines, hydrazone derivatives, carbazole derivatives, triazole derivatives, imidazole derivatives, oxadiazole derivatives having an amino group, and polythiophene, for instance.

The electron acceptor material of the organic layer 26 in a PV device may include perylene tetracarboxidiimide, perylene tetracarboxidiimidazole, anthtraquinone acridone pigment, polycyclic quinone, naphthalene tetracarboxidiimidazole, CN- and $CF_3$-substituted poly(phenylene vinylene), and Buckminsterfullerene, for instance. Further, the electron acceptor material may also include an electron transport material, such as metal organic complexes of 8-hydroxyquinoline; stilbene derivatives; anthracene derivatives; perylene derivatives; metal thioxinoid compounds; oxadiazole derivatives and metal chelates; pyridine derivatives; pyrimidine derivatives; quinoline derivatives; quinoxaline derivatives; diphenylquinone derivatives; nitro-substituted fluorine derivatives; and triazines, for example.

As previously described, the transparent film 20 is advantageously capable of reel-to-reel processing. Accordingly, the deposition of the thin organic light emitting polymer layers in the organic layer 26 may be more difficult than in conventional, small-area indicator lighting OLEDs or small PV devices, for example. It should be understood that to apply the various layers that constitute the organic layer 26, a number of coating steps may be implemented. Accordingly, further discussion regarding disposition of the organic layer 26 generally refers to a number of iterative coating steps. Also, as previously described, the layers deposited on the transparent film 20 may not comprise continuous layers. That is to say that each of the ITO layer 24, the organic layer 26 and the top electrode 28 (described below with reference to FIG. 9) may be deposited or patterned into precisely aligned patches or pixels. While patterned deposition of the ITO layer 24 and the top electrode 28 may be achieved by conventional means, deposition of the organic layers may be more difficult. The following techniques for disposing the organic layer 26 are merely provided by way of example. As can be appreciated, other techniques for disposing the organic layer 26 may be implemented.

One technique of disposing the organic layer 26 is "microgravure coating" which is a continuous coating process specially adapted to apply thin uniform layer of low-viscosity liquids. An engraved roll ("gravure roll") having a small diameter is dipped with coating solution, thereby filling the cells or grooves in the surface of the roll. Excess liquid may be scraped from the surface of the roll. The gravure roll is reverse-wiped across a moving tensioned reel-to-reel surface, such as the transparent film 20 having the ITO layer 24 disposed thereon, to transfer a fraction of the liquid contained in the engraving onto the surface. Because microgravure is a continuous coating technique, the disposed layer may be subsequently patterned. One patterning technique is to apply a patterned monolayer that will either attract or repel the underlying coating. Alternatively, the coating may be patterned via a laser ablation process. As can be appreciated, the organic layer 26 may remain as a continuous layer since the patterning (pixelating) of the electrodes (ITO layer 24 and the top electrode 28) may provide sufficient electrical isolation.

Alternatively a gravure printing is a process where the desired pattern is directly engraved on the gravure roll as millions of tiny cells. The roll is directly pressed onto the application surface to transfer coating from these cells. The organic material layer may be disposed onto the surface of the ITO layer 24 through a series of elastohydrodynamic processes, as can be appreciated by those skilled in the art.

Further, flexographic printing, screen printing or inkjet printing may be implemented to dispose the individual organic materials that form the organic layer 12. Flexographic printing is a process wherein the area to be printed is raised on a flexible plate attached to a roll. Coating is transferred to the raised image from an engraved roll, after which the coating is transferred to the surface. Rotary screen printing uses a squeegee to push coating through open areas of a fine fabric mesh onto the substrate. Inkjet printing starts with drop formation at the nozzle of an inkjet device. The drop is dispensed onto the surface and inertial force causes the drop to spread as it hits the surface.

Alternatively, the organic layer 26 may comprise multiple layers of small organic molecules that may be deposited in a vacuum chamber, as can be appreciated by those skilled in the art. Small organic molecules may be deposited by organic vapor phase deposition (OVPD), for instance. The OVPD process may implement a carrier gas stream to deposit the thin layers of the organic molecules. Various OVPD techniques may be implemented using high temperature and high pressure deposition or low temperature and low pressure deposition, for example, as can be appreciated by those skilled in the art. In certain instances, it may be advantageous to implement physical vapor deposition techniques, chemical vapor deposition, spin coating, or spraying, using a mask, rather than the reel-to-reel techniques described above, as can be appreciated by those skilled in the art.

Figure 9:
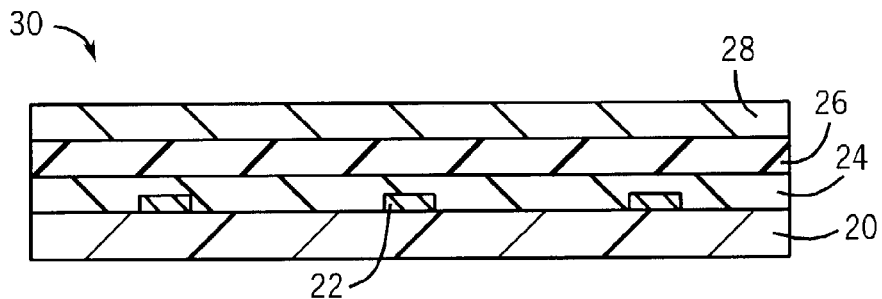

Referring now to FIG. 9, the top electrode 28 is disposed to complete the active portion 30 of the large area organic device. As will be described further below with reference to FIGS. 10–13, after fabrication of the active portion 30, the active portion 30 may be coupled to the transparent backer 16. The top electrode 28 may be disposed at a thickness in the range of approximately 500–2500 angstroms. The top electrode 28 preferably comprises aluminum. Alternatively, the top electrode 28 may comprise calcium, magnesium or silver, for example. For OLED devices, the top electrode 28 is advantageously reflective to reflect impinging light toward the front of the device where it can be coupled to the ambient environment. As can be appreciated, when a voltage potential is produced across the top electrode 28 and the bottom electrode (ITO layer 24), light is emitted from the organic layer 26. Further, the top electrode 28 provides hermeticity for the backside of the organic device, as can be appreciated by those skilled in the art. As previously described, the top electrode 28 may be patterned or pixelated to align with a pattern that may be formed in the TCO layer 24 to reduce device failures caused by shorting between the electrodes. As can be appreciated, if the top electrode 28 is patterned, it may not provide adequate hermeticity for the organic device. Accordingly, an additional layer may be disposed over the top electrode 28 to provide hermeticity.

Figure 10:
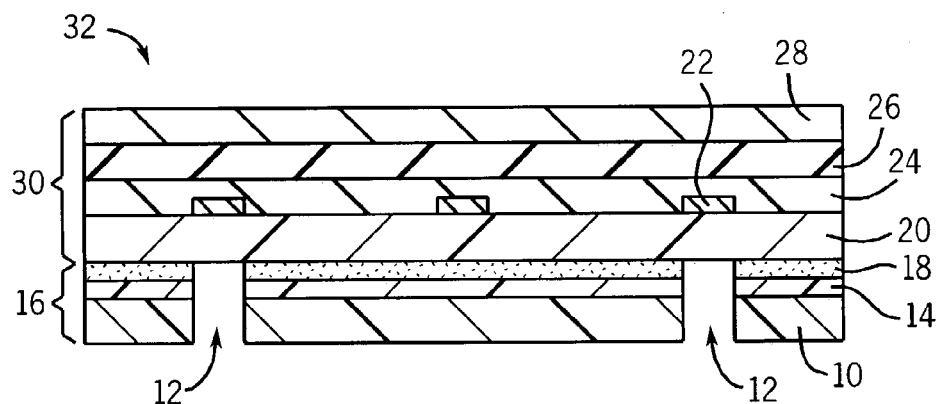
FIGS. 10–13 illustrate cross-sectional views of an exemplary fabrication process of a large-area organic device implementing the transparent backer of FIGS. 1–4 and the active portion of FIGS. 5–9 in accordance with the present techniques.

FIGS. 10–13 illustrate cross-sectional views of an exemplary fabrication process of a large-area organic device implementing the transparent backer of FIGS. 1–4 and the active portion of FIGS. 5–9. Specifically, FIG. 10 illustrates an organic device 32 comprising the active portion 30 coupled to the transparent backer 16. As illustrated in FIG. 10, the active portion 30 is coupled to the transparent backer 16 such that the metal grid 22 of the active portion 30 aligns with the apertures 12 of the transparent backer 16. Advantageously, by applying the transparent backer 16 late in the manufacturing process (i.e. after the formation of the active portion 30), the active portion 30 may be fabricated using low-cost, high volume reel-to-reel equipment. As can be appreciated, the active portion 30 is coupled to the transparent backer 16 via the adhesive layer 18. The rigidity of the transparent backer 16 provides structural support for the organic device 32. The active portion 30 may be coupled to the transparent backer 16 by applying mechanical pressure to one or both of the active portion 30 and the transparent backer 16 such that they are forced together. In one exemplary technique, the active portion 30 and the transparent backer 16 may be pressed using one or more rollers. Further, depending on the adhesive 18, the organic device 32 may be advantageously cured at room temperature, for example. As can be appreciated, because the active portion 30 may have been fabricated in a reel-to-reel system, the active portion 30 may be cut into panels before or after adhesion to the transparent backer 16. As can be appreciated, the active portion 30 may be cut to match the dimensions defined by the plastic 10 of the transparent backer 16.

Figure 11:
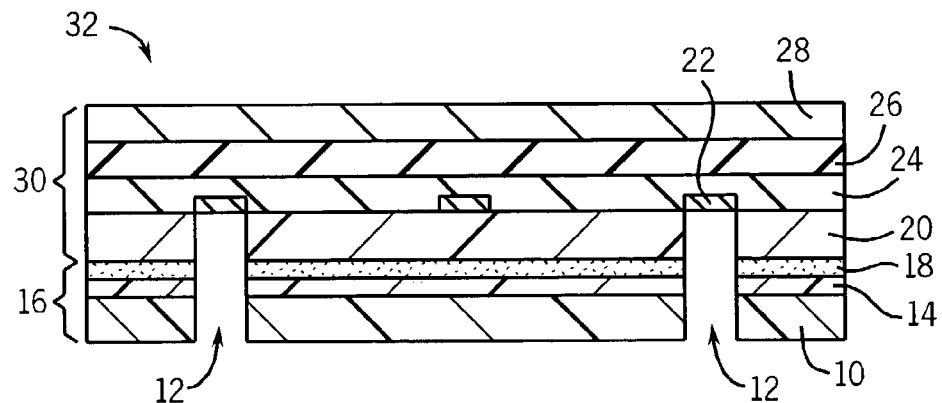

To provide electrical current to the bottom electrode (ITO layer 24) in an OLED device or to receive electrical current from the bottom electrode in a PV device, electrical leads may be coupled to the metal grid 22. To provide access to the metal grid 22, the apertures 12 are extended through the transparent film 20, as illustrated in FIG. 11. By creating openings in the transparent film 20 through the apertures 12, the underlying metal grid 22 is exposed through the apertures 12. The openings in the transparent film 20 may be created by laser ablation, for example. As can be appreciated, in one exemplary embodiment, openings may not be provided to expose all of the isolated segments in the metal grid 22, as illustrated in FIG. 11.

Figure 12:
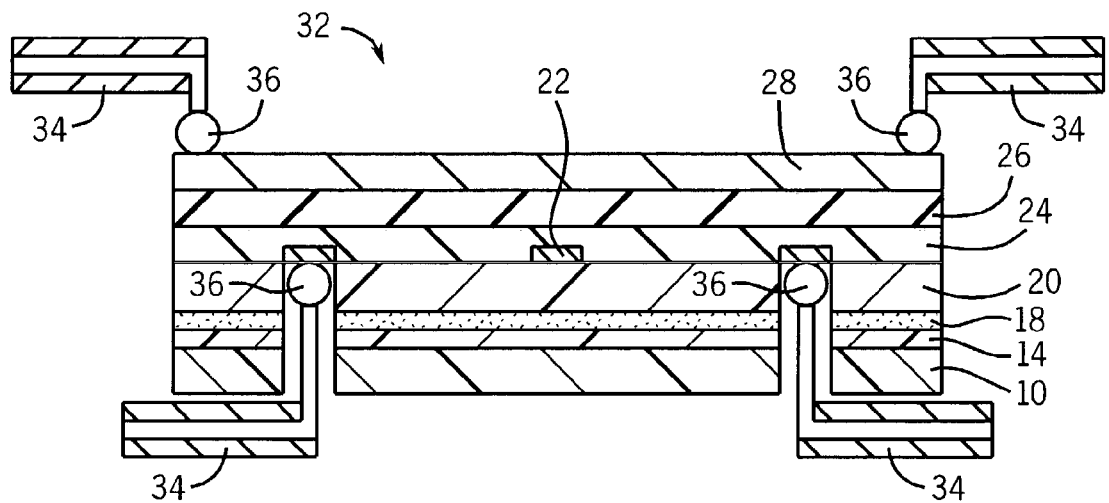

Referring to FIG. 12, exemplary electrical leads 34 are illustrated. The electrical leads 34 may comprise insulated wire having an uninusulated end portion, as illustrated in FIG. 12. The length of the uninsulated end portion may vary depending on whether the electrical leads 34 are coupled to the top electrode 28 or the metal grid 22. For instance, the uninsulated end portion of each electrical lead 34 coupled to the metal grid 22 may be long enough to extend through the depth of the aperture 12, as illustrated in the present exemplary embodiment. The electrical leads 34 may be coupled to the top electrode 28 or the metal grid 22 via a conductive material 36. The conductive material 36 may comprise a conductive paste or epoxy that can be cured at room temperature or cured by low temperature heating, for instance. Alternatively, the conductive material 36 may comprise solder ball that may be cured using a low temperature curing process. The conductive material 36 should be such that it can be cured at a temperature (e.g., less than 180° C.). As can be appreciated, exposure of the organic layer 26 to high temperatures (e.g., greater than 180° C.) may be undesirable since it may reduce the light emitting ability of the organic layer 26. Further, once the electrical leads 34 are attached to the metal grid 22, the apertures 12 may be filled with a conductive or non-conductive sealing material (not illustrated).

Figure 13:
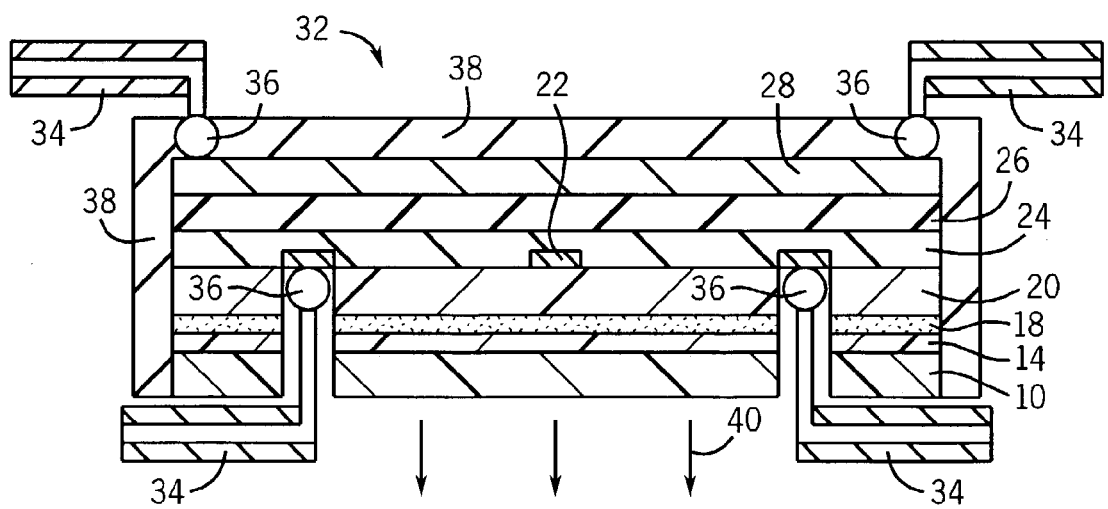

The organic device 32 may be sealed by an encapsulating layer 38, as illustrated in FIG. 13. The encapsulating layer 38 provides further hermeticity for the organic device 32 to further protect the device from external elements. The encapsulating layer 38 may be disposed over the top electrode 28 and along the sides of the organic device 32. As can be appreciated, when an electrical potential is provided through the electrodes 34 in an OLED device, the polymers in the organic layer 26 are activated and light is produced. The light is emitted through the transparent layers in the front of the large area organic (OLED) device 32 such that it is coupled into the ambient environment, as illustrated by light indicator arrows 40. As can be appreciated, the present organic (OLED) device 32 may be used as a large area, general lighting source. Alternatively, if the organic device comprises a PV device, when light is directed to the organic device 32, the electrical current created through the electron transfer in the organic layer 26 may be delivered from the organic device 32 via the electrodes 34, as can be appreciated by those skilled in the art.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating an organic device comprising the acts of:
    fabricating a transparent backer portion, wherein a plurality of apertures are formed in the transparent backer portion;
    fabricating an active portion, wherein the active portion comprises an organic layer disposed between a first electrode and a second electrode;
    coupling the transparent backer portion to the active portion; and
    coupling electrical leads to each of the first electrode and the second electrode.

2. The method, as set forth in claim 1, wherein the act of fabricating the transparent backer portion comprises the acts of:
    providing a plastic layer having a front surface area of greater than one square foot;
    forming a plurality of apertures in the plastic layer;
    disposing a hermetic coating over the plastic layer; and
    disposing an adhesive layer over the hermetic coating.

3. The method, as set forth in claim 2, wherein the act of providing a plastic layer comprises the act of providing a polycarbonate layer.

4. The method, as set forth in claim 2, wherein the act of disposing an adhesive layer comprises the act of disposing an adhesive layer comprising phosphor particles.

5. The method, as set forth in claim 2, comprising the act of disposing a color changing layer between the hermetic coating and the adhesive layer.

6. A method of fabricating an organic device comprising the acts of:
    fabricating a transparent backer portion; and
    fabricating an active portion, wherein the act of fabricating the active portion comprises the acts of:
        providing a transparent film;
        disposing a metal layer on the transparent film;
        forming a grid in the metal layer;
        disposing the first electrode over the metal layer and the transparent film;
        disposing the organic layer over the first electrode; and
        disposing the second electrode over the organic layer;
    coupling the transparent backer portion to the active portion; and
    coupling electrical leads to each of the first electrode and the second electrode.

7. The method, as set forth in claim 6, wherein the act of providing a transparent film comprises the act of providing a flexible transparent film from a reel.

8. The method, as set forth in 6, wherein the act of disposing a metal layer comprises the act of disposing an aluminum layer.

9. The method, as set forth in claim 6, wherein the act of forming a grid comprises the act of patterning the metal layer to form electrically isolated squares.

10. The method, as set forth in claim 6, wherein the act of disposing the first electrode comprises the act of disposing a transparent conductive layer.

11. The method, as set forth in claim 10, wherein the act of disposing the transparent conductive layer comprises the act of disposing an indium-tin-oxide (ITO) layer.

12. The method, as set forth in claim 6, wherein the act of disposing the second electrode comprises the act of disposing an aluminum layer over the organic layer.

13. The method, as set forth in claim 6, wherein the act of coupling the electrical leads to the first electrode comprises the acts of:
    forming a plurality of openings in the transparent film, through a plurality of apertures in the transparent backer portion, wherein the apertures and openings are coincident with the grid pattern formed in the metal layer such that the metal layer is exposed through the apertures and openings;
    disposing a conductive material into the openings such that the conductive material is electrically coupled to the metal layer; and
    electrically coupling wires to the conductive material.

14. The method, as set forth in claim 6, wherein the act of fabricating the transparent backer portion comprises the acts of:
    providing a plastic layer having a front surface area of greater than one square foot;
    forming a plurality of apertures in the plastic layer;
    disposing a hermetic coating over the plastic layer; and
    disposing an adhesive layer over the hermetic coating.

15. The method, as set forth in claim 14, wherein the act of providing a plastic layer comprises the act of providing a polycarbonate layer.

16. The method, as set forth in claim 14, wherein the act of disposing an adhesive layer comprises the act of disposing an adhesive layer comprising phosphor particles.

17. The method, as set forth in claim 14, comprising the act of disposing a color changing layer between the hermetic coating and the adhesive layer.

18. A method of fabricating an organic device comprising the acts of:
   providing a flexible transparent film;
   forming a metal grid pattern on the flexible transparent film;
   disposing a transparent conductive oxide (TCO) layer over the metal grid pattern and the transparent film;
   disposing the organic layer over the transparent conductive oxide layer; and
   disposing a metal layer over the organic layer.

19. The method, as set forth in claim 18, wherein the act of providing a flexible transparent film comprises the act of providing the flexible transparent film from a reel.

20. The method, as set forth in claim 18, wherein the act of providing the flexible transparent film comprises the act of providing a flexible transparent film having a width in the range of approximately 1–2 feet.

21. The method, as set forth in claim 18, wherein the act of forming a grid comprises the act of patterning a metal layer to form a plurality of electrically isolated metal squares.

22. The method, as set forth in claim 18, wherein the act of disposing the transparent conductive layer comprises the act of disposing an indium-tin-oxide (ITO) layer.

23. The method, as set forth in claim 18, wherein the act of disposing the organic layer comprises the act of disposing a plurality of layers comprising organic polymers.

24. The method, as set forth in claim 18, wherein the act of disposing the metal layer comprises the act of disposing an aluminum layer over the organic layer.

25. The method, as set forth in claim 18, comprising the act of coupling electrical leads to each of the metal grid pattern and the metal layer.

26. The method, as set forth in claim 21, comprising the act of coupling electrical leads to some of the plurality of metal squares.

* * * * *